US012058833B2

(12) United States Patent
Potter

(10) Patent No.: US 12,058,833 B2
(45) Date of Patent: Aug. 6, 2024

(54) COMPUTING SYSTEM HAVING A PIVOTABLE FRONT PANEL

(71) Applicant: HEWLETT PACKARD ENTERPRISE DEVELOPMENT LP, Houston, TX (US)

(72) Inventor: Andrew Potter, Houston, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 0 days.

(21) Appl. No.: 17/688,548

(22) Filed: Mar. 7, 2022

(65) Prior Publication Data

US 2022/0192044 A1 Jun. 16, 2022

Related U.S. Application Data

(63) Continuation of application No. 16/861,888, filed on Apr. 29, 2020, now Pat. No. 11,297,729.

(51) Int. Cl.
*H05K 5/02* (2006.01)
*A47B 88/48* (2017.01)
*A47B 88/95* (2017.01)
*H05K 7/14* (2006.01)
*H05K 7/16* (2006.01)

(52) U.S. Cl.
CPC ........ *H05K 7/1489* (2013.01); *A47B 88/48* (2017.01); *A47B 88/95* (2017.01); *H05K 7/16* (2013.01)

(58) Field of Classification Search
CPC ........ H05K 7/1489; H05K 7/16; H05K 5/226; A47B 88/48; A47B 88/95; G06F 1/181
See application file for complete search history.

(56) References Cited

U.S. PATENT DOCUMENTS

| 815,535 A | * | 3/1906 | Illig | ........................ | A47B 88/48 312/303 |
| 2,584,173 A | | 2/1952 | Van Fowler | | |
| 2,775,501 A | | 12/1956 | Kyllo | | |

(Continued)

FOREIGN PATENT DOCUMENTS

| CN | 206421305 U | 8/2017 |
| CN | 208141286 U | 11/2018 |

(Continued)

*Primary Examiner* — Kimberley S Wright
(74) *Attorney, Agent, or Firm* — Hewlett Packard Enterprise Patent Department

(57) ABSTRACT

Example implementations relate to a computing system having a chassis and a front panel pivotably coupled to the chassis via a pair of retention brackets. In some examples, the chassis has a pair of frames that is disposed spaced apart and in parallel to each other. Further, each retention bracket of the pair of brackets is movably coupled to a respective frame of the pair of frames. The front panel is releasably engaged to the pair of frames and pivotably coupled to the pair of retention brackets such that the front panel is movable independently relative to the chassis. During installation and maintenance of the computing system, the front panel is movable linearly along a radial direction relative to the pair of frames and rotatable independently relative to the pair of retention brackets so as to provide clearance for accessing interiors of the chassis.

19 Claims, 4 Drawing Sheets

(56) References Cited

U.S. PATENT DOCUMENTS

| | | | |
|---|---|---|---|
| 3,404,930 A * | 10/1968 | Cafiero | A47B 57/04 |
| | | | 312/313 |
| 5,169,221 A | 12/1992 | Wheeler | |
| 6,636,426 B2 | 10/2003 | Inman | |
| 7,269,020 B2 | 9/2007 | Wang et al. | |
| 8,811,000 B2 | 8/2014 | Zhao et al. | |
| 9,635,771 B2 | 4/2017 | Head | |
| 10,178,793 B1 * | 1/2019 | Hsu | H05K 7/1488 |
| 10,234,911 B2 | 3/2019 | Chiu | |
| 11,297,729 B2 * | 4/2022 | Potter | A47B 88/48 |
| 2002/0093785 A1 | 7/2002 | Chi et al. | |
| 2004/0228083 A1 | 11/2004 | Wang et al. | |
| 2005/0276008 A1 * | 12/2005 | Chen | G06F 1/181 |
| | | | 361/679.02 |
| 2011/0181157 A1 | 7/2011 | Lin | |
| 2015/0070867 A1 | 3/2015 | Head | |
| 2016/0077297 A1 * | 3/2016 | Wells | E05D 3/12 |
| | | | 16/371 |
| 2017/0048992 A1 * | 2/2017 | Katsaros | H05K 7/1489 |
| 2017/0196357 A1 | 7/2017 | Head | |
| 2019/0124421 A1 * | 4/2019 | Ruiz | H04Q 1/025 |
| 2019/0364681 A1 | 11/2019 | Hangebrauck et al. | |

FOREIGN PATENT DOCUMENTS

| | | |
|---|---|---|
| CN | 110888500 A | 3/2020 |
| WO | 2016/207955 A1 | 12/2016 |

\* cited by examiner

COMPUTING SYSTEM HAVING A PIVOTABLE FRONT PANEL

BACKGROUND

A data center rack includes a plurality of computing systems, each including a plurality of electronic devices. A chassis of each computing system fits into the data center rack. The chassis includes a tray to receive the electronic devices for processing, storage, memory, networking, graphics accelerating, and the like. The electronic devices may be arranged on the tray of the chassis in a variety of ways by accessing a combination of a front panel and a top panel depending on the type of electronic devices, purpose of the electronic devices, and the computing needs.

BRIEF DESCRIPTION OF THE DRAWINGS

Various examples will be described below with reference to the following figures.

DETAILED DESCRIPTION

Figure 1:
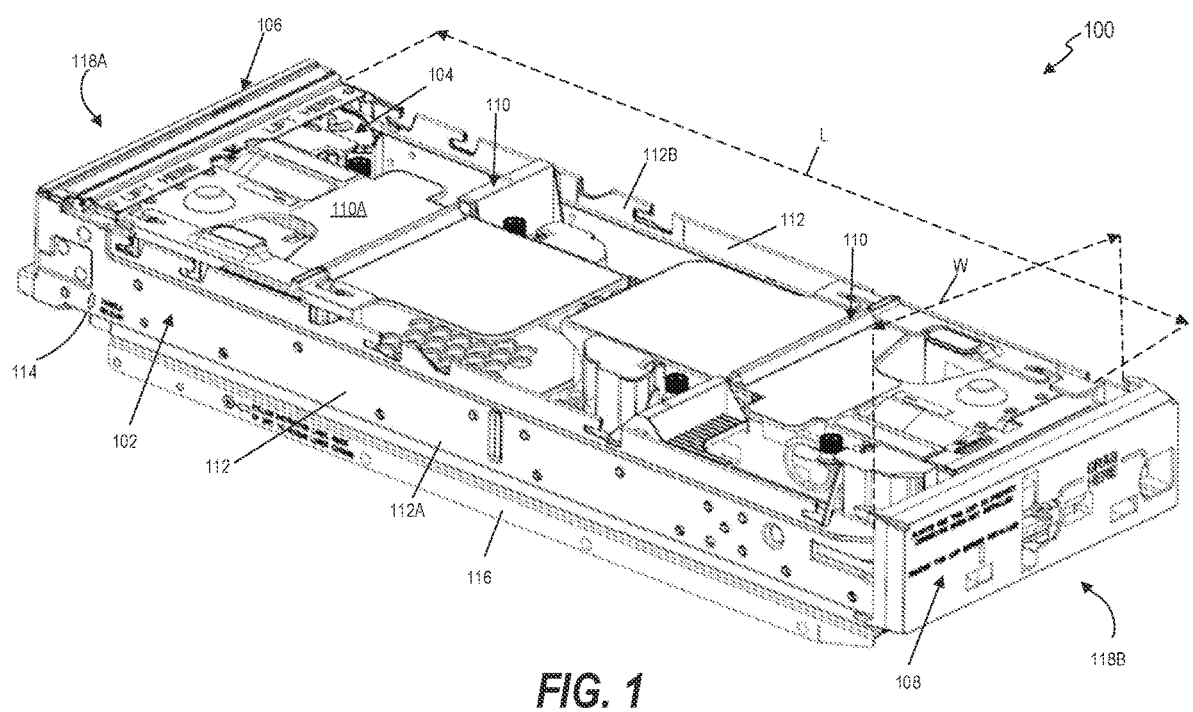
FIG. 1 illustrates a schematic diagram of an example computing system.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing examples only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

The present disclosure describes example implementations of a computing system, such as a graphic expansion node having a chassis and a front panel pivotably coupled to the chassis via a pair of retention brackets. In such examples, the chassis has a pair of frames disposed spaced apart from each other and parallel to one another. Each retention bracket of the pair of retention brackets is movably coupled to a respective frame of the pair of frames. The front panel is releasably engaged to the pair of frames and pivotably coupled to the pair of retention brackets such that the front panel is movable independently relative to the pair of retention brackets and securely retained to the chassis via the pair of retention brackets. During installation of an electronic module having one or more electronic devices on a tray of the computing system or during maintenance of the electronic module, the front panel is moved linearly along a radial direction relative to the pair of frames and rotated independently relative to the pair of retention brackets for providing clearance to access interiors of the chassis or the tray of the computing system.

For purposes of explanation, certain examples are described with reference to the devices illustrated in FIGS. 1-4. The functionality of the illustrated devices may overlap, however, and may be present in a fewer or greater number of elements and devices. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 4A-4C is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Typically, a data center rack is designed to provide a variety of computing solutions. The design of the data center rack may balance conflicts between power density, spatial layout, temperature requirements, acoustic noise, and other factors. The type of electronic devices installed in each computing system of the data center rack may depend on the computing solutions, and the power and cooling requirements. In some examples, the data center rack may include different types of computing systems, such as a compute node, a graphics expansion node, a storage node, an input/output node, and the like. Typically, one or more electronic devices are stored in an electronic module and such electronic module is loaded on a chassis tray of the computing system. In some example, the electronic module for the graphics expansion node may include the one or more electronic devices, such as graphic processors, graphic accelerators, heat sinks, fans, peripheral component interconnect (PCI) express cards, and the like. The graphics expansion node having such electronic module, is housed in at least one rack of the data center rack.

In some examples, the electronic module may be loaded into the computing system by removing a plurality of panels of the computing system, for example, a top panel and a front panel of the chassis. Whenever a service or a new hardware configuration of the computing system is to be performed, all electronic modules loaded in the chassis are shut down, and the top and front panels are removed to access the desired electronic modules from the chassis. Thus, a customer or a technician may have to completely remove the front panel after removing the top panel, and securely retain the front panel while servicing or configuring the desired electronic modules are completed. Further, the customer or the technician may handily require an appropriate tool, for example, a screw driver for removing screws to detach the front panel from the chassis or fastening the screws to attach the front panel to the chassis. In such examples, any loss of the front panel or the fasteners, such as screws may initiate replacement request from the customer or the technician, and associated downtime of the computing system till the replacement is completed.

A technical solution to the aforementioned issues may include implementing a computing system having a tool-less design for a front panel to releasably engage to the chassis, and a mechanism for the front panel to partially move out of the way for providing clearance to access interiors of the chassis, and securely retain the front panel to the chassis. In some examples, the computing system includes the chassis, a pair of retention brackets, and the front panel. In such examples, the chassis includes a pair of frames spaced apart from each other. Each retention bracket is movably coupled to a respective frame of the pair of frames and the front panel is releasably engaged to the pair of frames and pivotably coupled to the pair of retention brackets. Therefore, the front panel may be lifted upwards to disengage from the pair of frames, and turned outwards from the pair of frames to provide clearance for accessing the interiors of the chassis. Accordingly, the computing system of the present disclosure may not require a separate tool to engage/disengage the front panel from the chassis and securely retain the front panel to the chassis. Therefore, the tool-less design and the pivot mechanism for the front panel may improve the serviceability of the computing system and save the customer's or technician's time during service events and configuration events of the computing system. Further, the mechanism as described hereinabove may additionally prevent removal of other features of the front panel including an electromagnetic induction (EMI) gasket and a latching interaction for providing clearance to access the interiors of the chassis.

In some examples, each frame of the pair of frames includes a pair of first pins and a second pin. Further, each retention bracket of the pair of retention brackets includes a hinge pin and a pair of elongated slots. The pair of elongated slots is engaged to the pair of first pins to movably couple the pair of retention brackets to the pair of frames. The front panel includes a top section and a bottom section, where the top section includes a protruded section extending towards a back panel and a pair of walls. Each wall of the pair of walls is disposed at a peripheral side of the protruded section and coupled to bottom surface of the protruded section. In such examples, each wall of the pair of walls includes a dimple. The bottom section includes a pair of flanges, where each flange has a hole. The dimple of each wall of the pair of walls is releasably engaged to the second pin of respective frame of the pair of frames to detectably couple the front panel to the pair of frames. The hinge pin of each retention bracket extends through the hole of a respective flange of the pair of flanges to pivotably couple the front panel to the pair of retention brackets.

FIG. 1 is a schematic diagram of a computing system 100, in accordance to some examples of the present disclosure. In one example, the computing system 100 is a graphics expansion node mounted on a compute node, and loaded collectively to a data center rack. In certain examples, the graphics expansion node may include a plurality of electronic devices used to rapidly process visual data. In other words, the graphics expansion node may be used to boost the performance of the compute node by offloading visual data-processing tasks from a processing resource of the compute node to the graphics expansion node. Thus, freeing up the processing resource to perform other non-visual data-processing tasks.

In some examples, the computing system 100 includes a chassis 102, a pair of retention brackets 104 (one bracket of the pair of retention brackets 104 is shown in FIG. 1), a front panel 106, a back panel 108, a top panel (not shown), and a pair of electronic modules 110. In some examples, the top panel may be disposed on the chassis 102 covering the pair of electronic modules 110 and a portion of the front panel 106 and the back panel 108, and detachably coupled to a pair of frames 112 of the chassis 102. It may be noted herein that the top panel is not shown in FIG. 1, for ease of illustration of other components of the computing system 100, for example, the pair of retention brackets 104 and the pair of the electronic modules 110, and such an illustration should not be construed as a limitation of the present disclosure.

As discussed hereinabove, the chassis 102 includes the pair of frames 112, for example, a first frame 112A and a second frame 112B that are spaced apart from each other and arranged parallel to one another. The chassis 102 further includes a tray 114 disposed at a bottom portion of the computing system 100 and coupled to the pair of frames 112. For example, the tray 114 extends along an entire length "L" and width "W" of the computing system 100. In such examples, the computing system 100 further includes a pair of railings 116 (one railing of the pair of railings is shown in FIG. 1) coupled to a bottom portion of the pair of frames 112. In some examples, the pair of railings 116 may be used to mount the computing system 100 on another computing system, such as a compute node.

Each retention bracket of the pair of retention brackets 104 is disposed inside the pair of frames 112 and located proximate to the front panel 106. The pair of retention brackets 104 is movably coupled to a respective frame of the pair of frames 112. The other features of each retention bracket of the pair of retention brackets 104 and the mechanism of connecting each retention bracket 104 to the respective frame 112 are described in greater details below.

The front panel 106 is located at a front side 118A of the computing system 100. In some examples, the front panel 106 is releasably engaged to the pair of frames 112 and pivotably coupled to the pair of frames 112 via the pair of retention brackets 104. The other features of the front panel 106 and the mechanism of connecting the front panel 106 to the pair of frames 112 and to the pair of retention brackets 104 are described in greater details below. The back panel 108 is located at a rear side 118B of the computing system 100. In some examples, the back panel 108 may include a plurality of connectors (not shown) that may be used for connecting the computing system 100 to other electronic devices of the data center rack.

The pair of electronic modules 110 is disposed within the chassis 102. In one example, the pair of electronic modules 110 are arranged adjacent to one another, and loaded on the tray 114. Additionally, each electronic module of the pair of electronic modules 110 is located between the pair of frames 112. In some examples, each electronic module of the pair of electronic modules 110 may include one or more of a printed circuit assembly (PCA), a graphic processor unit (GPU), a random-access memory (RAM), buses, a graphics accelerator, a peripheral component interconnect (PCI) express card, an input/output card, and the like.

In one or more examples, some portions of the pair of electronic modules, for example, a first electronic module 110A extends inside the front panel 106. In other words, the front panel 106 may overlap some portions of the first electronic module 110A. Thus, during servicing or configuring the computing system 100, a customer or a technician may have to remove the top panel and rotate the front panel 106 outwardly relative to the chassis 102 for providing clearance to interiors of the computing system 100 to load/unload the first electronic module 110A from the chassis 102. Thus, the computing system 100 of the present disclosure provides a tool-less design for a front panel 106 to releasably engage/disengage to the chassis 102, and a mechanism for the front panel 106 to partially move out of the way for providing clearance to the interiors of the chassis 102 to access the first electronic modules 110A loaded on the chassis 102, and securely retain the front panel 106 to the chassis 102.

Figure 2:
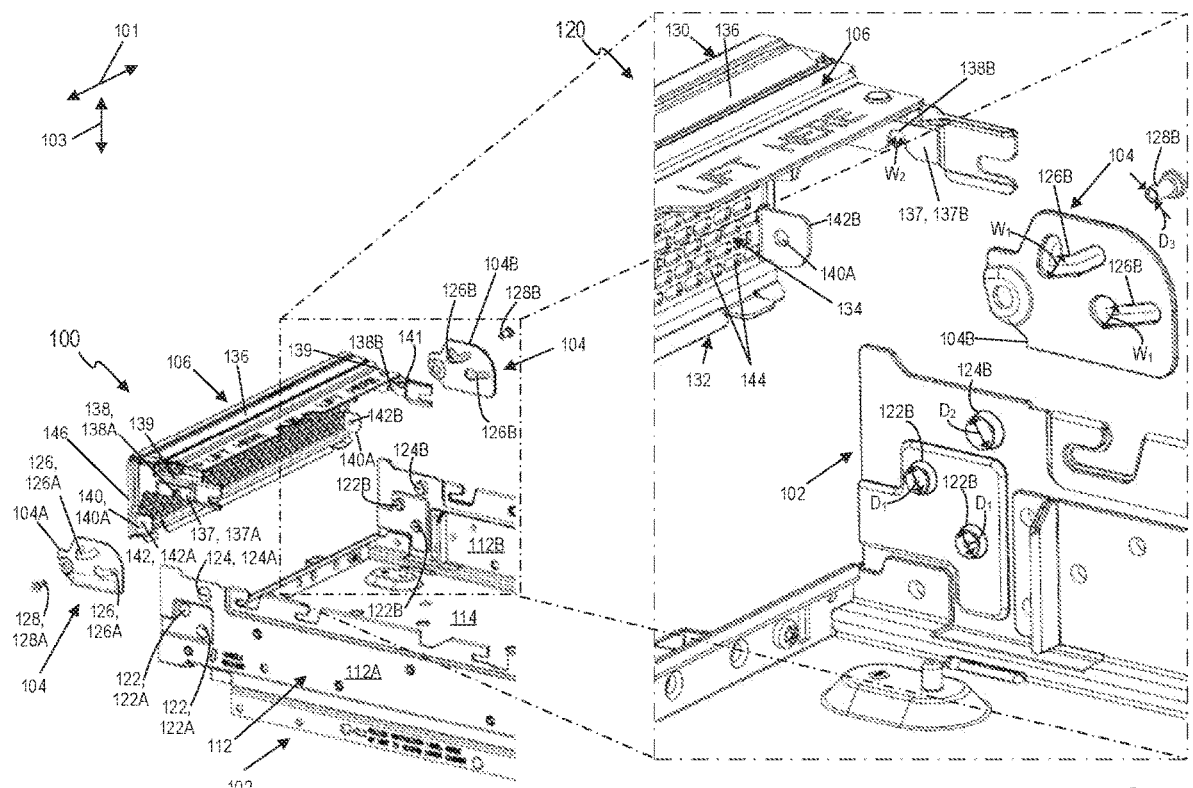
FIG. 2 illustrates an exploded view of a portion of the computing system of FIG. 1, having a chassis, a pair of first retention brackets, and a front panel.

FIG. 2 is an exploded view of a portion 120 of a computing system 100 of FIG. 1, in accordance to some examples of the present disclosure. As discussed hereinabove, the portion 120 of the computing system 100 includes a chassis 102, a pair of retention brackets 104, and a front panel 106. It may be noted herein that the portion 120 of the computing system 100 does not show a first electronic module 110A (shown in FIG. 1) for ease of illustration, and such an illustration should not be construed as a limitation of the present disclosure.

The chassis 102 includes a pair of frames 112, for example, a first frame 112A and a second frame 112B that are spaced apart from one another. The chassis 102 further includes a tray 114 disposed at a bottom portion of the computing system 100 connecting the first and second frames 112A, 112B to each other. In some examples, each frame of the pair of frames 112 includes a pair of first pins 122 and a second pin 124. The pair of first pins 122 is spaced apart from one another. In some examples, a head of each pin of the pair of first pins 122 has a first diameter "$D_1$" and a head of the second pin 124 has a second diameter "$D_2$".

In some examples, the first frame 112A of the pair of frames 112, includes a pair of first pins 122A and a second pin 124A. Similarly, the second frame 112B of the pair of frames 112, includes a pair of first pins 122B and a second pin 124B. Each pin of the pair of first pins 122 and the second pin 124 extend inwardly along an axial direction 101 towards a mutually opposite frame of the pair of frames 112. For example, the pair of first pins 122A and the second pin 124A extend inwardly towards the second frame 112B. Similarly, the pair of first pins 122B and the second pin 124B extend inwardly towards the first frame 112A.

In one example, the pair of first pins 122, the second pin 124, and the pair of frames 112 are discrete components. In such examples, the pair of first pins 122 and the second pin 124 are rigidly coupled to each frame of the pair of frames 112 by using a coupling mechanism, for example, rivets or welding, and the like. For example, the pair of first pins 122A and the second pin 124A are rigidly coupled to the first frame 112A, and the pair of first pins 122B and the second pin 124B are rigidly coupled to the second frame 112B. In another example, the pair of first pins 122A, the second pin 124A, and the first frame 112A are integrated components. Similarly, the pair of first pins 122B, the second pin 124B, and the second frame 112B are integrated components.

In some examples, the pair of retention brackets 104 includes a first retention bracket 104A and a second retention bracket 104B. Each retention bracket of the pair of retention brackets 104 includes a first pair of elongated slots 126 and a first hinge pin 128. For example, the first retention bracket 104A includes a first pair of elongated slots 126A and a first hinge pin 128A. Similarly, the second retention bracket 104B includes a second pair of elongated slots 126B and a second hinge pin 128B. The pair of elongated slots 126 is spaced apart from one another and arranged parallel to one another. Additionally, each elongated slot of the pair of elongated slots 126 has an L-shaped profile and has a width "$W_1$". Further, the first hinge pin 128A extends inwardly along the axial direction towards the second frame 112B. Similarly, the second hinge pin 128B extends inwardly along the axial direction towards the first frame 112A. Further, a tail of the hinge pin 128 has a third diameter "$D_3$".

In one example, the hinge pin 128 and each retention bracket of the pair of retention brackets 104 are discrete components. In such examples, the hinge pin 128 is rigidly coupled to each retention bracket 104 by using the coupling mechanism, for example, rivets or welding, and the like. For example, the first hinge pin 128A is rigidly coupled to the first retention bracket 104A and the second hinge pin 128B is rigidly coupled to the second retention bracket 104B. In another example, the first hinge pin 128A and the first retention bracket 104A are integrated components. Similarly, the second hinge pin 128B and the second retention bracket 104B are integrated components.

In one or more examples, the pair of first pins 122 may be engaged to the pair of elongated slots 126 so as to movably couple each retention bracket 104 to the respective frame 112. In such examples, each pin of the pair of first pins 122 has the first diameter "$D_1$", which is greater than the width "$W_1$" of a respective elongated slot of the pair of elongated slots 126 so as to restrict the lateral movement of the front panel along the axial direction 101. In other words, each pin of the pair of first pins 122 has a wider head in comparison with the width "$W_1$" of each elongated slot of the pair of elongated slots 126 so as to prevent the pair of first pins 122 to get dislodged from the pair of elongated slots 126. Further, the pair of first pins 122 may restrict movement of each retention bracket of the pair of retention brackets 104 along the pair of elongated slots 126.

The front panel 106 has a top section 130, a bottom section 132, and a display section 134 connecting the top and bottom sections 130, 132 respectively. The top section 130 includes a protruded section 136 extending towards the back panel 108 (as shown in FIG. 1), and a pair of walls 137. Each wall of the pair of walls 137 is disposed at a peripheral side 139 of the protruded section 136 and coupled to a bottom surface 141 of the protruded section 136. In such examples, each wall of the pair of walls 137 includes a dimple 138. The bottom section 132 includes a pair of flanges 140, where each flange of the pair of flanges 140 has a hole 142. For example, the pair of walls 137 includes a first wall 137A having a first dimple 138A, and a second wall 137E having a second dimple 138B. The pair of flanges 140 includes a first flange 140A having a first hole 142A, and a second flange 140B having a second hole 142B. Each dimple of the first and second dimples 138A, 138B has a width "$W_2$". The display section 134 has a plurality of perforations 144 and includes an electromagnetic induction (EMI) gasket 146 coupled along a perimeter of the display section 134.

In some examples, the front panel 106 may be releasably engaged to the chassis 102. For example, each dimple of the first and second dimples 138A, 138B may be releasably engaged to the second pin 124 of a respective frame of the pair of frames 112. In some examples, the second pin 124 has the second diameter "$D_2$" which is greater than the width "$W_2$" of a respective dimple 138 so as to restrict the lateral movement of the front panel 106 along the axial direction 101. Further, the hinge pin 128 may extend through the hole 142 of a respective flange of the pair of flanges 140 to pivotably couple the front panel 106 to the pair of retention brackets 104.

Figures 3A, 3B:
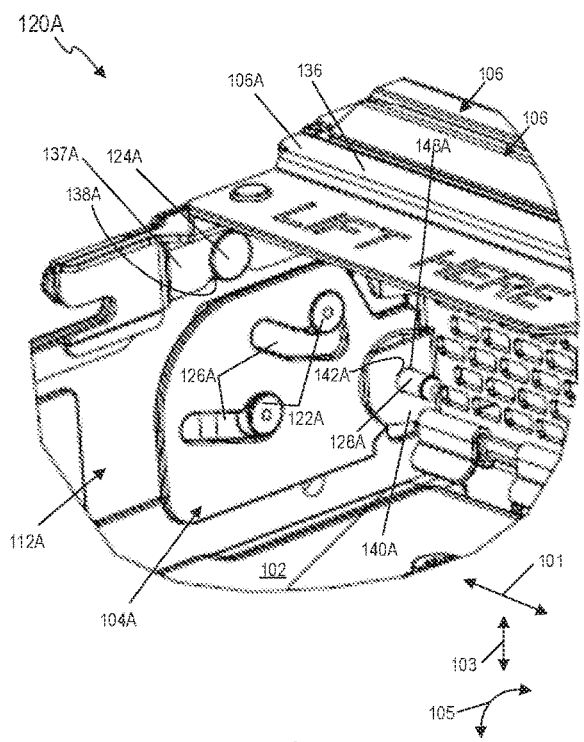
FIG. 3A illustrates an assembled view of a portion of the computing system of FIG. 2, having a portion of a chassis, a first retention bracket, and a portion of a front panel.
FIG. 3B illustrates an assembled view of another portion of the computing system of FIG. 2, having another portion of a chassis, a second retention bracket, and another portion of a front panel.
Figure 4A:
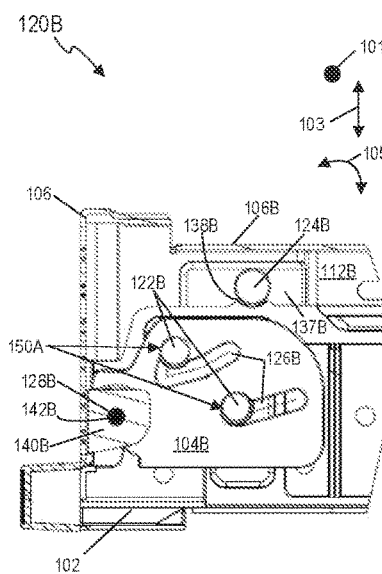
FIG. 4A illustrates a schematic diagram of another portion of the computing system of FIGS. 2 and 3B having a second retention bracket moved to a first position relative to a chassis.
Figure 4B:
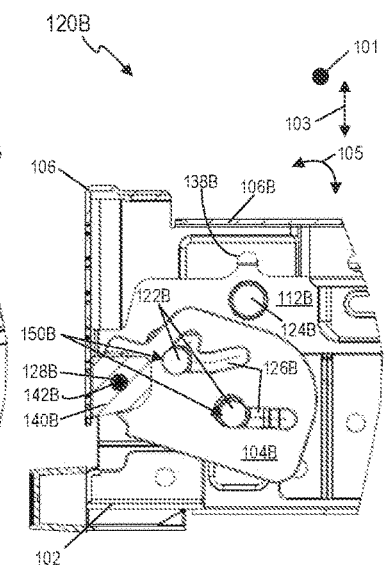
FIG. 4B illustrates a schematic diagram of another portion of the computing system of FIGS. 2 and 3B having a second retention bracket moved to a second position relative to a chassis.
Figure 4C:
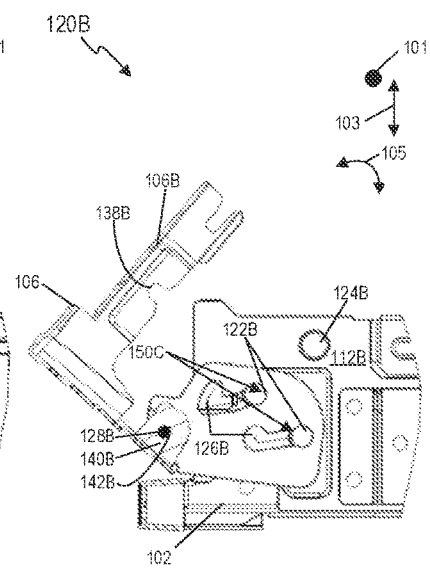
FIG. 4C illustrates a schematic diagram of another portion of the computing system of FIGS. 2 and 3B having a second retention bracket moved to a third position relative to a chassis.

FIG. 3A is an assembled view of a portion 120A of the computing system 100 of FIG. 2, in accordance to some examples of the present disclosure. The portion 120A of the computing system 100 includes a first frame 112A, a first retention bracket 104A, and a portion 106A of a front panel 106.

In some examples, the first frame 112A includes a pair of first pins 122A and a second pin 124A. The first retention bracket 104A includes a first pair of elongated slots 126A and a first hinge pin 128A. The front panel 106 includes a protruded section 136 and a first wall 137A coupled to the protruded section, where the first wall 137A has a first dimple 138A, and a first flange 140A has a first hole 142A. In some examples, the pair of first pins 122A is rigidly coupled to the first frame 112A, the first hinge pin 128A is rigidly coupled to the first retention bracket 104A, and the first flange 140A is rigidly coupled to the portion 106A of the front panel 106.

In one or more examples, the pair of first pins 122A is engaged to the first pair of elongated slots 126A so as to movably couple the first retention bracket 104A to the first frame 112A. The front panel 106 is releasably engaged to the chassis 102 and pivotably coupled to the first retention bracket 104A. For example, the first dimple 138A is releasably engaged to the second pin 124A of the first frame 112A, and the first hinge pin 128A extends through the first hole 142A of the first flange 140A so as to pivotably couple the portion 106A of the front panel 106 to the first frame 112A via the first retention bracket 104A.

During servicing or configuration of the computing system 100, the portion 106A of the front panel 106 may be first lifted upwards along a radial direction 103 to disengage the protruded section 136 from the first frame 112A. For example, the linear movement of the protruded section 136 enables the first dimple 138A to get disengaged from the second pin 124A. Later, the front panel 106 may be turned outwardly along a rotational direction 105 relative to a pivot point 148A to provide clearance to access interiors of a chassis 102. For example, the rotational movement of the protruded section 136 enables the portion 106A of the front panel 106 to turn outwards relative to the first retention bracket 104A for providing access to the chassis 102. In such examples, the first retention bracket 104A, which is pivotably coupled to the portion 106A of the front panel 106 and movably coupled to the first frame 112A, may securely retain the portion 106A of the front panel 106 to the chassis 102. Further, the pair of first pins 122A may restrict movement of the first retention bracket 104A along the first pair of elongated slot 126A.

FIG. 3B is an assembled view of a portion 120B of the computing system 100 of FIG. 2, in accordance to some examples of the present disclosure. The portion 120B of the computing system 100 includes a second frame 112B, a second retention bracket 104B, and another portion 106B of a front panel 106.

In some examples, the second frame 112B includes a pair of first pins 122B and a second pin 124B. The second retention bracket 104B includes a second pair of elongated slots 126B and a second hinge pin 128B. The front panel 106 includes a protruded section 136 and a second wall 137B coupled to the protruded section 136, where the second wall 137B has a second dimple 1388, and a second flange 140B has a second hole 142B. In some examples, the pair of first pins 122B is rigidly coupled to the second frame 112B, the second hinge pin 128B is rigidly coupled to the second retention bracket 104B, and the second flange 140B is rigidly coupled to the other portion 106B of the front panel 106.

In one or more examples, the pair of first pins 122B is engaged to the second pair of elongated slots 126B so as to movably couple the second retention bracket 1048 to the second frame 112B. The front panel 106 is releasably engaged to the chassis 102 and pivotably coupled to the second retention bracket 1048. For example, the second dimple 138B is releasably engaged to the second pin 124B of the second frame 112B, and the second hinge pin 128B extends through the second hole 142B of the second flange 140B so as to pivotably couple the other portion 106B of the front panel 106 to the first frame 112A via the second retention bracket 104B.

During servicing or configuration of the computing system 100, the other portion 106B of the front panel 106 may be first lifted upwards along a radial direction 103 to disengage the second wall 1378 of the protruded section 136 from the second frame 112B. For example, the linear movement of the protruded section 136 enables the second dimple 138B to get disengaged from the second pin 124B. Later, the front panel 106 may be turned outwardly along a rotational direction 105 relative to a pivot point 1488 to provide clearance to access interiors of a chassis 102. For example, the rotational movement of the protruded section 136 enables the other portion 106A of the front panel 106 to turn outwards relative to the second retention bracket 104B for providing access to the chassis 102. In such examples, the second retention bracket 104B, which is pivotably coupled to the other portion 106B of the front panel 106 and movably coupled to the second frame 112B, may securely retain the other portion 106B of the front panel 106 to the chassis 102. Further, the pair of first pins 122B may restrict movement of the second retention bracket 164E along the second pair of elongated slots 126B.

FIGS. 4A, 4B, and 4C are schematic diagrams of another portion 120B of the computing system 100 of FIGS. 2 and 3B, in accordance to some examples of the present disclosure. The other portion 120B of the computing system 100 includes another portion of a second frame 112B, a second retention bracket 104B, and another portion 106B of a front panel 106.

Referring to FIG. 4A, the other portion 106B of the front panel 106 is disposed on the second frame 112B such that a second pin 124B is engaged to a second dimple 138B. The second hinge pin 128B extends through the second hole 142B of the second flange 140B such that the other portion 106B of the front panel 106 is pivotably coupled to the second retention bracket 104B. The pair of first pins 122B is engaged to the second pair of elongated slots 126B such that the second retention bracket 104B is movably coupled to the second frame 112B. In an example, the second retention bracket 104B is held at a first position 150A relative to the pair of first pins 122B.

Referring to FIG. 4B, during servicing or configuration of the computing system 100, a customer or a technician may lift the other portion 106B of front panel 106 upwards along a radial direction 103, to disengage the portion 106B of the front panel 106 from the second frame 112B. During such linear movement of the front panel 106, the second dimple 138B gets disengaged from the second pin 124B and the second retention bracket 104B may slide upwards relatively to the pair of first pins 122B, and move from the first position 150A to a second position 150B.

Further, referring to FIG. 4C, the customer or the technician may later independently turn the other portion 106A of the front panel 106 outwards along a rotational direction 105 relative to the second retention bracket 104B to provide clearance to access interiors of a chassis 102. During such rotational movement of the portion 106B of the front panel 106, the second retention bracket 104B may slide sideways relatively to the pair of first pins 122B, and move from the second position 150B to a third position 150C. In such examples, the customer or the technician may later access desired electronic modules, for example, a first electronic module 110A (as shown in FIG. 1) from the chassis 102. In some examples, the customer or the technician may unload the first electronic module 110A from a tray and perform servicing to one or more electronic devices disposed within the first electronic module 110A.

After servicing the first electronic module 110A and reloading the first electronic module 110A on the tray of the chassis 102, the customer or the technician may independently turn back the other portion 106A of the front panel 106 inwards along the rotational direction 105 relative to the second retention bracket 104B. During such rotational movement of the portion 106B of the front panel 106, the second retention bracket 104B may slide back relatively to the pair of first pins 122B, and move from the third position 150C to the second position 150B. Further, the customer or the technician may push the other portion 106B of front panel 106 downwards along the radial direction 103, to engage the portion 106B of the front panel 106 to the second frame 112B. During such linear movement of the front panel 106, the second dimple 138B gets engaged to the second pin 124B and the second retention bracket 104B may slide downwards relatively to the pair of first pins 122B, and move from the second position 150B to the first position 150A.

Accordingly, the computing system of the present disclosure may not require a separate tool to engage/disengage a front panel from a chassis and securely retain the front panel to the chassis. Therefore, the tool-less design and the pivot mechanism for the front panel may improve the serviceability of the computing system and save the customer or technician's time during service events and configuration of the computing system. Further, the mechanism as described hereinabove may additionally prevent removal of other features of the front panel including electromagnetic induction (EMI) gasket and latching interaction for providing clearance to access the interiors of the chassis.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A chassis of an electronic device, comprising:
 a base;
 two side walls coupled to the base and comprising two frames arranged opposite from one another;
 two retention brackets, each movably coupled to one of the frames; and
 a panel pivotably coupled to the retention brackets about a pivot axis, the panel comprising a face which forms a front or back panel of the chassis and a protruding portion that extends perpendicular from the face,
 wherein, in a closed position of the panel, the face is perpendicular to the base and the side walls and the protruding portion extends parallel to the base;
 wherein in a first state, the panel is in the closed position and the panel and retention bracket prevent all motion of the panel relative to the frames other than translation of the panel along a first direction parallel to the panel while allowing translation of the panel along the first direction, wherein in the first state the protruding portion engages at least one pin affixed to at least one of the frames to prevent rotation of the panel about the pivot axis;
 wherein in a second state, the protruding portion is disengaged from the at least one pin and the panel and retention bracket allow rotation of the panel relative to the frame and translation of the panel relative to the frame in a second direction perpendicular to the first direction while the panel remains attached to the frames; and
 wherein the panel and retention brackets are configured to be transitioned from the first state to the second state by translating the panel in the first direction relative to the frames to disengage the protruding portion from the at least one pin.

2. The chassis of claim 1, wherein the retention brackets are rotatable and translatable relative to the frames.

3. The chassis of claim 2, wherein transitioning the panel and retention brackets from the first state to the second state causes the retention brackets to rotate between a first orientation and a second orientation relative to the frames.

4. The chassis of claim 2, wherein, in the second state, translation of the panel in the second direction causes translation of the retention brackets in the second direction relative to the frames.

5. The chassis of claim 1, wherein the retention brackets are coupled to the frames via a plurality of slots and a plurality of pins, wherein the pins are movable within the slots to allow for relative motion between the retention brackets and the frames.

6. The chassis of claim 5, wherein at least one of the plurality of slots comprises a curved path.

7. The chassis of claim 6, wherein the curved path comprises an L-shaped path.

8. The chassis of claim 5, wherein each of the frames comprises two pins of the plurality of pins and each of the retention brackets comprises two slots of the plurality of slots.

9. The chassis of claim 1, wherein the protruding portion comprises a dimple configured to engage with the at least one pin coupled to one of the frames, wherein in an engaged state of the dimple engaged with the pin, the pin prevents movement of the protruding portion parallel to the base and prevents movement of the protruding portion towards the base while allowing movement of the protruding portion along the first direction away from the base.

10. The chassis of claim 1,
wherein each of the frames comprises a pair of first pins and a second pin,
wherein each retention brackets comprises a pair of elongated slots engaged with the pair of first pins of one of the frames to movably couple each retention bracket to the frame.

11. A computing system comprising:
the chassis of claim 1; and
one or more electronic components coupled to the chassis.

12. The computing system of claim 11, wherein the retention brackets are rotatable and translatable relative to the frames.

13. The computing system of claim 11, wherein the retention brackets are coupled to the frames via a plurality of slots and a plurality of pins, wherein the pins are movable within the slots to allow for relative motion between the retention brackets and the frames.

14. A method of opening a panel of a chassis of an electronic device, comprising:
in a first state of the panel in which the panel is in a closed position and secured to a pair of frames of the chassis such that the panel cannot move other than to translate in a first direction parallel to the panel, transitioning the panel to a second state in which the panel can rotate relative to the frames and translate in a second direction relative to the frames while remaining attached to the frames by a pair of retention brackets,
wherein the panel comprises a face which forms a front or back panel of the chassis and a protruding portion that extends perpendicular from the face,
wherein in the closed position of the panel the face is perpendicular to the base and the side walls and the protruding portion extends parallel to a base of the chassis,
wherein in the first state the protruding portion engages at least one pin affixed to at least one of the frames to prevent rotation of the panel about the pivot axis;
wherein transitioning the panel to the second state comprises translating the panel in the first direction and thereby disengaging the protruding portion from the at least one pin; and
in the second state of the panel, rotating the panel relative to the frames and translating the panel along the second direction relative to the frames, wherein the second direction is perpendicular to the first direction.

15. The method of claim 14, wherein translating the panel in the first direction comprises causing the retention brackets to rotate from a first orientation to a second orientation.

16. The method of claim 14, wherein translating the panel along the second direction in the second state comprises translating the retention brackets along the second direction relative to the frames.

17. The chassis of claim 1, wherein in an open position of the panel, the face is titled outwardly away from the side walls.

18. The chassis of claim 17,
wherein each of the frames comprises a second pin and each of the retention brackets comprise an L-shaped slot comprising a long slot segment and a short slot segment coupled together at an angle, wherein the L-shaped slots of the retention brackets are engaged with the second pins of the frames;
wherein in the first state, the second pins are located within the short slot segments of the L-shaped slots, respectively;
wherein transitioning the panel from the first state to the second state by translating the panel along the first direction causes the retention brackets to rotate relative to the frames and the second pins to move into the long slot segments of the L-shaped slots;
wherein the panel is transition from the second state to the open position by translating the brackets and the panel relative to the frames along the second direction and rotating the panel outwardly about the pivot axis to the open position, the translating of the brackets relative to the frames causing the second pins to move along the long slot segments of the L-shaped slots.

19. The chassis of claim 17,
in transition between the closed position and the open position of the panel, the pivot axis moves away from the frames along the second direction.

* * * * *